(12) United States Patent
Kim

(10) Patent No.: US 9,478,770 B2
(45) Date of Patent: Oct. 25, 2016

(54) ORGANIC LIGHT EMITTING DISPLAY DEVICE AND METHOD OF MANUFACTURING THE SAME

(71) Applicant: Samsung Display Co., Ltd., Yongin, Gyeonggi-Do (KR)

(72) Inventor: Yong-Jin Kim, Cheonan-si (KR)

(73) Assignee: Samsung Display Co., Ltd., Giheung-Gu, Yongin-si, Gyeonggi-Do (KR)

(*) Notice: Subject to any disclaimer, the term of this patent is extended or adjusted under 35 U.S.C. 154(b) by 0 days.

(21) Appl. No.: 14/561,562

(22) Filed: Dec. 5, 2014

(65) Prior Publication Data

US 2015/0228927 A1    Aug. 13, 2015

(30) Foreign Application Priority Data

Feb. 12, 2014 (KR) .......................... 10-2014-0015892

(51) Int. Cl.
  *H01L 29/08* (2006.01)
  *H01L 51/52* (2006.01)
  *H01L 51/56* (2006.01)

(52) U.S. Cl.
  CPC ....... *H01L 51/5256* (2013.01); *H01L 51/5209* (2013.01); *H01L 51/5225* (2013.01); *H01L 51/56* (2013.01)

(58) Field of Classification Search
  CPC ........... H01L 51/5256; H01L 51/5209; H01L 51/5225; H01L 51/56
  USPC ......................................... 257/40; 438/82, 99
  See application file for complete search history.

(56) References Cited

U.S. PATENT DOCUMENTS

| 6,894,432 B2* | 5/2005 | Fujieda et al. ................. 313/506 |
| 2004/0160170 A1* | 8/2004 | Sato et al. ..................... 313/504 |
| 2011/0121346 A1* | 5/2011 | Yamada et al. ................. 257/98 |
| 2012/0133275 A1 | 5/2012 | Lee et al. |
| 2012/0153293 A1* | 6/2012 | Koyama et al. ................. 257/72 |
| 2013/0009154 A1 | 1/2013 | Choi et al. |
| 2013/0016047 A1* | 1/2013 | Masumoto ..................... 345/173 |
| 2013/0187163 A1 | 7/2013 | Kim et al. |
| 2014/0299867 A1* | 10/2014 | Ono et al. ....................... 257/40 |

FOREIGN PATENT DOCUMENTS

| KR | 10-2012-0037738 | 4/2012 |
| KR | 10-2012-0057286 | 6/2012 |
| KR | 10-2013-0005854 | 1/2013 |
| KR | 10-2013-0085195 | 7/2013 |

* cited by examiner

*Primary Examiner* — Phat X Cao
*Assistant Examiner* — Mohammad M Hoque
(74) *Attorney, Agent, or Firm* — Robert E. Bushnell, Esq.

(57) ABSTRACT

An organic light emitting display (OLED) device includes a substrate, a plurality of first electrodes, a plurality of light emitting layers, a second electrode, a power supply line, a third electrode, and an encapsulation member. The third electrode that is formed on the power supply line and the second electrode that is formed on the light emitting layers extend to a contact region that is in a peripheral region of the substrate. The third electrode and the second electrodes have an uneven pattern in the contact region.

10 Claims, 9 Drawing Sheets

ORGANIC LIGHT EMITTING DISPLAY DEVICE AND METHOD OF MANUFACTURING THE SAME

CLAIM OF PRIORITY

This application makes reference to, incorporates the same herein, and claims all benefits accruing under 35 U.S.C. §119 from an application earlier filed in the Korean Intellectual Property Office on 12 Feb. 2014 and there duly assigned Serial No. 10-2014-0015892.

BACKGROUND OF THE INVENTION

1. Field of the Invention

Example embodiments of the present invention relate generally to a display device. More particularly, embodiments of the present invention relate to an organic light emitting display device and a method of manufacturing the organic light emitting display device.

2. Description of the Related Art

An organic light emitting display (OLED) device displays information of images or characters by using light generated when holes and electrons that are provided from an anode and a cathode, respectively are combined with each other at an organic light emitting layer interposed between the anode and the cathode. The OLED device has been spotlighted as one of the next-generation display devices due to various characteristics of the OLED device such as a wide viewing angle, a rapid response speed, a thin thickness, low power consumption, etc. The OLED device may be divided into a display region on which the images are displayed and a peripheral region that surrounds the display region. Organic light emitting elements in the display region may be coupled to a power supply line in the peripheral region. The organic light emitting elements may receive a power supply signal through the power supply line.

Recently, a technique that decreases an area of the peripheral region is developed for a slim display device. Thus, a contact area in which the organic light emitting elements and the power supply line are coupled may be decreased. When the contact area in which the organic light emitting elements and the power supply line are coupled is decreased, a contact resistance may be increased, which results in an increase of power consumption and occurrence of a color abnormality phenomenon.

SUMMARY OF THE INVENTION

Some example embodiments provide an organic light emitting display (OLED) device capable of increasing a contact area in which an organic light emitting element and a power supply line are coupled.

Some example embodiments provide a method of manufacturing an OLED device capable of increasing a contact area in which an organic light emitting element and a power supply line are coupled.

According to an aspect of example embodiments, an organic light emitting display (OLED) device may include a substrate having a display region and a peripheral region, a plurality of first electrodes disposed in the display region, a plurality of light emitting layers formed on the first electrodes, a second electrode formed on the light emitting layers, the second electrode extending to a contact region and having an uneven pattern in the contact region, a power supply line disposed in the peripheral region, a third electrode formed on the power supply line, the third electrode extending to the contact region and having the uneven pattern in the contact region to contact with the second electrode having the uneven pattern, and an encapsulation member encapsulating the display region and the peripheral region.

In example embodiments, the uneven pattern may include at least one concave portion formed in a circular shape.

In example embodiments, the uneven pattern may include at least one concave portion formed in a diamond-like shape.

In example embodiments, the uneven pattern may include at least one concave portion formed in a rectangular shape.

In example embodiments, the third electrode may be disposed under the second electrode in the contact region.

In example embodiments, the third electrode and the first electrode may be simultaneously formed.

In example embodiments, the OLED device may further include a plurality of switching structures formed on the substrate.

In example embodiments, the OLED device may further include a light efficiency improvement layer interposed between the second electrode and the encapsulation member, the light efficiency improvement layer configured to increase a light emission efficiency.

In example embodiments, the OLED device may further include a protective layer interposed between the second electrode and the encapsulation member, the protective layer configured to protect the first electrodes, the light emitting layers, and the second electrode during a forming process of the encapsulation member.

In example embodiments, the encapsulation member may be formed by alternately laminating organic layers and inorganic layers.

According to an aspect of example embodiments, a method of manufacturing an organic light emitting (OLED) device may include disposing a plurality of first electrodes in a display region of a substrate that includes the display region and a peripheral region, forming a plurality of light emitting layers on the first electrodes, forming a second electrode on the light emitting layers, the second electrode extending to a contact region and having an uneven pattern in the contact region, forming a power supply line in the peripheral region, forming a third electrode on the power supply line, the third electrode extending to the contact region and having the uneven pattern in the contact region to contact with the second electrode having the uneven pattern, and forming an encapsulation member to encapsulate the display region and the peripheral region.

In example embodiments, the uneven pattern may include at least one concave portion formed in a circular shape.

In example embodiments, the uneven pattern may include at least one concave portion formed in a diamond-like shape.

In example embodiments, the uneven pattern may include at least one concave portion formed in a rectangular shape.

In example embodiments, the third electrode may be disposed under the second electrode in the contact region.

In example embodiments, the third electrode and the first electrode may be simultaneously formed.

In example embodiments, the method of manufacturing the OLED device may further include forming a plurality of switching structures on the substrate.

In example embodiments, the method of manufacturing the OLED device may further include forming a light efficiency improvement layer between the second electrode and the encapsulation member to increase a light emission efficiency.

In example embodiments, the method of manufacturing the OLED device may further include forming a protective layer between the second electrode and the encapsulation member to protect the first electrodes, the light emitting layers, and the second electrode during a forming process of the encapsulation member.

In example embodiments, the encapsulation member may be formed by alternately laminating organic layers and inorganic layers.

Therefore, an organic light emitting display (OLED) device and a method of manufacturing the OLED device according to example embodiments may decrease a contact resistance by forming an uneven pattern in a contact region in which an emitting light structures and a power supply line are coupled. Thus, power supply voltage may be stably provided to the emitting light structures.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE EMBODIMENTS

Hereinafter, the present inventive concept will be explained in detail with reference to the accompanying drawings.

Figure 1:
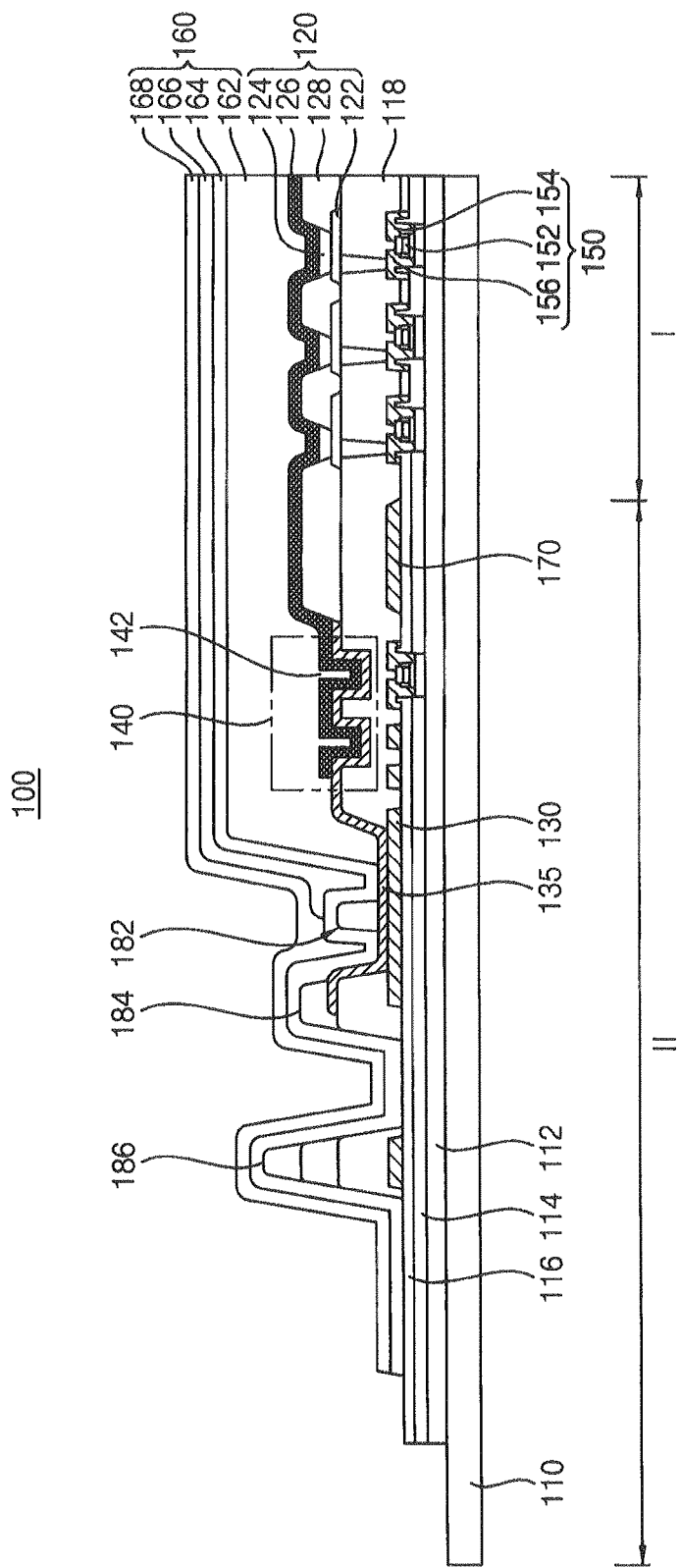
FIG. 1 is a cross-sectional view illustrating an organic light emitting display (OLED) device according to example embodiments.
Figure 2:
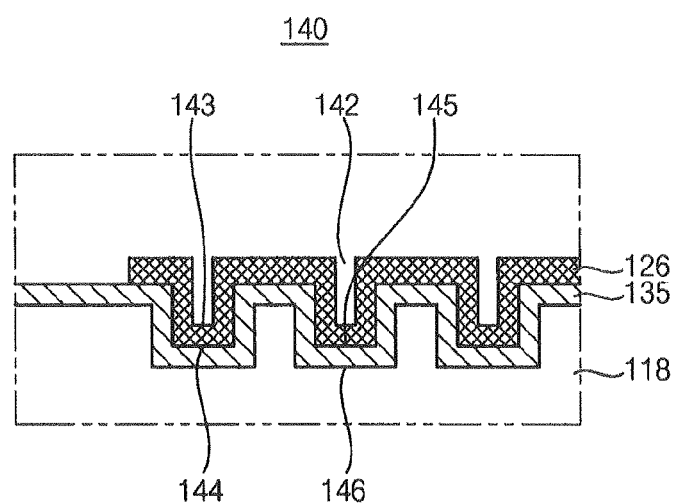
FIG. 2 is a cross-sectional view illustrating a contact region that is included in the OLED device of FIG. 1.

FIG. 1 is a cross-sectional view illustrating an organic light emitting display (OLED) device according to example embodiments and FIG. 2 is a cross-sectional view illustrating a contact region that is included in the OLED device of FIG. 1.

FIG. 1 is a cross-sectional view illustrating a pixel that is disposed in an outside of an organic light emitting display (OLED) device 100. In reference to FIG. 1, the OLED device may include a substrate 110, a plurality of light emitting structures 120, a power supply line 130, a third electrode 135, and an encapsulation member 160. The substrate 110 of the OLED device 100 may include a display region I and a peripheral region II. In an embodiment, the display region I displays the information of images or characters and the peripheral region II does not display the information and the peripheral region II surrounds the display region I. The light emitting structures 120 may be formed in the display region I of the substrate 110. The light emitting structures 120 may include a plurality of first electrodes 122, a plurality of light emitting layers 124 formed on the first electrodes 122, and a second electrode 126 formed on the light emitting layers 124. Here, the second electrode 126 may extend to a contact region 140. The second electrode 126 may have an uneven pattern in the contact region 140. The power supply line 130 may be disposed in the peripheral region II of the substrate 110. The third electrode 135 that is formed on the power supply line 130 may extend to the contact region 140. The third electrode 135 may have an uneven pattern in the contact region 140. In the contact region 140, the third electrode 135 may contact with the second electrode 126 having the uneven pattern. The encapsulation member 160 may be formed on the display region I and the peripheral region II. The encapsulation member 160 may prevent the light emitting structures 120 from oxygen and moisture penetration.

The substrate 110 of the OLED device 100 may include the display region I and the peripheral region II. In some example embodiments, the substrate 110 may include a flexible transparent resin. For example, the substrate 110 may include polymethylmethacrylate-based resin, polyimide-based resin, acryl-based resin, polyacrylate-based resin, polycarbonate-based resin, polyether-based resin, sulfonic acid-based resin, polyethylene terephthalate-based resin, etc. In other example embodiments, the substrate 110 may include a transparent ceramic substrate such as a glass substrate, a quartz substrate, a transparent alumina substrate, etc. A buffer layer 112 may be disposed on the substrate 110. The buffer layer 112 may allow upper structures to be easily formed on the substrate 110. Further, the buffer layer 112 may prevent diffusions of metal atoms or impurities from wirings, patterns, and electrodes containing metal.

The plurality of light emitting structures 120 may be formed in the display region I of the substrate 110. The light emitting structures 120 may include the first electrodes 122, light emitting layers 124, and the second electrode 126. The first electrodes 122 may be formed on an insulation layer 118. The first electrodes 122 may be spaced by a predetermined distance each other. A pixel defining layer 128 may be disposed on the first electrodes 122 and the insulation layer 118. The pixel defining layer 128 may extend to a data line 170 in the peripheral region II. The pixel defining layer 128 may have openings exposing the first electrodes 122, respectively. The light emitting layers 124 may be respectively disposed on the first electrodes 122 exposed by the openings of the pixel defining layer 128. Each of the light emitting layers 124 may have a multi layer structure that includes an organic light emitting layer (EL), a hole injection layer (HIL), a hole transfer layer (HTL), an electron transfer layer (ETL), an electron injection layer (EIL), etc. The organic light emitting layers of the light emitting layers 124 may include light emitting materials emitting different colors of light such as red color of light, blue color of light, and green color of light according to the types of the pixels. The organic light emitting layer of each light emitting layer 124 may include a plurality of stacked light emitting materials for emitting red color of light, blue color of light, and green color of light so as to substantially generate white color of light. The second electrode 126 may be disposed on the light emitting layers 124 and the pixel defining layer 128. The second electrode 126 may extend to the contact region 140 in the peripheral region II.

The light emitting structures 120 may be coupled to switching structures 150. Specifically, the first electrodes 122 of the light emitting structures 120 may be electrically coupled to the switching structures 150 passing through the insulation layer 124. For example, the switching structures 150 may be thin film transistors. Each of the thin film transistors may include a gate electrode 152, a source electrode 154, and a drain electrode 156. A gate insulation layer 114 may be disposed on the buffer layer 112. The gate insulation layer 114 may cover an active pattern of the thin film transistors. The gate electrode 152 of the thin film transistor may be disposed on the gate insulation layer 114. Although it is not illustrated in FIG. 1, lines such as gate lines that are electrically coupled to the gate electrode 152 may be disposed on the gate insulation layer 114. An insulating interlayer 116 that covers the gate electrodes 152 of the thin film transistors may be disposed on the gate insulation layer 114. The insulating interlayer 116 may insulate the gate electrode 152 of the thin film transistor from upper lines and the electrodes. The source electrodes 154 and the drain electrodes 156 may be formed on the insulating interlayer 116. Further, the data line 170 that is electrically coupled to the drain electrode 156 of the thin film transistor and the power supply line 130 that is electrically coupled to the light emitting structures 120 may be formed on the insulating interlayer 116.

The insulation layer 118 may be formed in the display region I and some portion of the peripheral region II. The insulation layer 118 may be formed to cover the switching structures 150. The insulation layer 118 may insulate the switching structures 150 from the first electrodes 122 of the light emitting structures 120. The insulation layer 118 may extend to the peripheral region II to cover the data line 170 and some portion of the power supply line 130 in the peripheral region II. The insulation layer 118 may have the uneven pattern in the contact region 140. In some example embodiments, the uneven pattern may include at least one concave portion 142 formed in a circular shape. In other example embodiments, the uneven pattern may include at least one concave portion 142 formed in a diamond-like shape. In other example embodiments, the uneven pattern may include at least one concave portion 142 formed in a rectangular shape. As shown in FIG. 2, the second electrode 126 formed on the insulation layer 118 has uneven pattern at the contact region 140, and such uneven pattern includes a recess 143 at the upper surface and a protrusion 144 geometrically corresponding to the recess 143 at the lower surface. As shown in FIG. 2, the third electrode 135 formed on the insulation layer 118 has uneven pattern at the contact region 140, and such uneven pattern includes a recess 145 at the upper surface and a protrusion 146 geometrically corresponding to the recess 145 at the lower surface.

The power supply line 130 may be formed in the peripheral region II of the substrate 110. The power supply line 130 may be formed on the insulating interlayer 116. The power supply line 130 may be simultaneously formed with the source electrodes 154, the data electrodes 156, the data line 170, etc. The power supply line 130 may provide power supply voltage to drive the light emitting structures 120. In some example embodiments, the power supply voltage may be a high power supply voltage ELVDD that is provided to the light emitting structure 120. In other example embodiments, the power supply voltage may be a low power supply voltage ELVSS that is provided to the light emitting structure 120. The third electrode 165 may be formed on the power supply line 130. The third electrode 135 may extend to the contact region 140. The third electrode 135 may contact with the second electrode 126 of the light emitting structure 120 in the contact region 140. Thus, the power supply line 130 and the light emitting structure 120 may be electrically coupled by contacting the third electrode 135 and the second electrode 126 in the contact region 140. The third electrode 135 may be simultaneously formed with the first electrode 122 of the light emitting structure 120. The third electrode 135 may be formed of the same material forming the first electrode 122.

The contact region 140 may be formed in the peripheral region II of the substrate 110. In reference to FIG. 2, the contact region 140 may be formed by sequentially laminating the third electrode 135 coupled to the power supply line 130 and the second electrode 126 of the light emitting structure 120 on the insulation layer 118 having uneven pattern. The third electrode 135 and the second electrode 126 may be formed along the uneven pattern formed on the insulation layer 118. In some example embodiments, the uneven pattern may have at least one concave portion 142 formed in a circular shape. In other example embodiments, the uneven pattern may have at least one concave portion 142 formed in a diamond-like shape. In other example embodiments, the uneven pattern may have at least one concave portion 142 formed in a rectangular shape. A contact area of the third electrode 135 and the second electrode 126 may be increased because the third electrode 135 and the second electrode are formed along the uneven pattern of the insulation layer 118. Although an area of the peripheral region II is decreased for a slim display device, the contact area of the third electrode 135 and the second electrode 126 may be increased by having the uneven pattern. Thus, a contact resistance may be decreased and power supply voltage may be stably provided to the light emitting structure 120.

The encapsulation member 160 may encapsulate the light emitting structures 120 in the display region I and the contact region 140 in the peripheral region II. A first organic layer 162 may be disposed on the light emitting structures 120 and the contact region 140. The first organic layer 162 may improve the flatness of the display region I and may protect the light emitting structures 120. Further, the first organic layer 162 may prevent a diffusion of impurities from the underlying structures. For example, the first organic layer 162 may include polyimide-based resin, polyacryle-based resin, polyamide-based resin, etc. A first inorganic layer 164 may be disposed on the first organic layer 162. The first inorganic layer 164 may prevent the first organic layer 162 and the light emitting structures 120 from being deteriorated by the permeation of moisture, oxygen, etc. Further, the first inorganic layer 164 may protect the first organic layer 162 and the light emitting structures 120 from external impacts. The first inorganic layer 164 may include metal compound. For example, the first inorganic layer 164 may include silicon nitride, aluminum nitride, zirconium nitride, titanium nitride, hafnium nitride, tantalum nitride, silicon oxide, aluminum oxide, titanium oxide, tin oxide, cerium oxide, silicon oxynitride, aluminum, etc. A second organic layer 166 may be disposed on the first inorganic layer 164. The second organic layer 166 may perform functions the same as or similar to those of the first organic layer 162, and also the second organic layer 166 may include material the same as or similar to that of the first organic layer 162. A second inorganic layer 168 may be disposed on the second organic layer 166. The second inorganic layer 168 may perform functions the same as or similar to those of the first inorganic layer 164, and the second inorganic layer 168 may include material the same as or similar to that of the first inorganic layer 164. The encapsulation member 160 may include at least one additional organic layer and at least one additional inorganic layer according to application, dimensions, components, etc.

A first blocking structure 182, a second blocking structure 184, and a third blocking structure 186 may be disposed in the peripheral region II to prevent a leakage of the first organic layer 162 and the second organic layer 166. The first through third blocking structure 182, 184, and 186 may be formed by laminating at least one insulation layer on a metal pattern.

As described above, the OLED device 100 may include the contact region 140 in the peripheral region II of the substrate 100. In the contact region 140, the third electrode 135 that is coupled to the power supply line 130 and the second electrode 126 of the light emitting structure 120 may be sequentially laminated on the uneven pattern of the insulation layer 118. The contact area of the third electrode 135 and the second electrode 126 may be increased because the third electrode 135 and the second electrode 126 are formed along the uneven pattern of the insulation layer 118. Although the area of the peripheral region II is decreased for a slim display device, the contact area of the third electrode 135 and the second electrode 126 may be increased by having the uneven pattern. Thus, the contact resistance may be decreased and the power supply voltage may be stably provided to the light emitting structure 120.

Figure 3A:
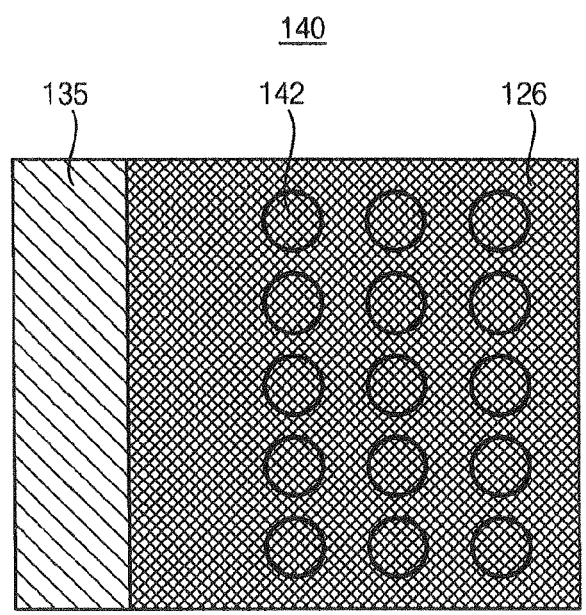
FIG. 3A is a plane view illustrating an example of forming the contact region of the FIG. 2.
Figure 3B:
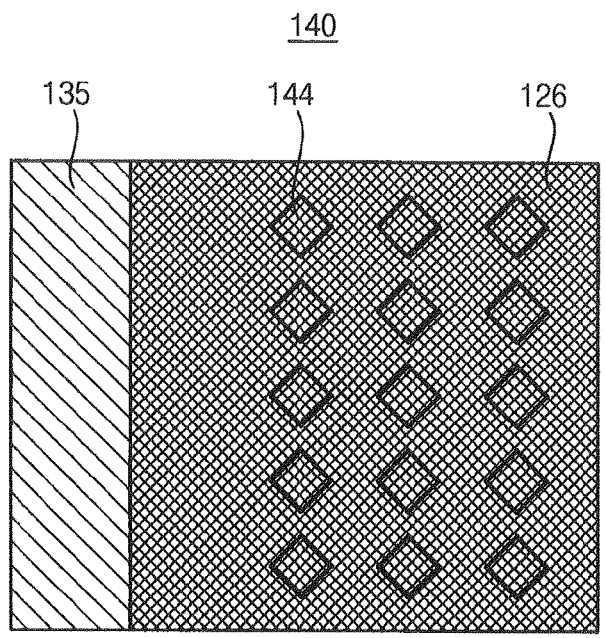
FIG. 3B is a plane view illustrating another example of forming the contact region of the FIG. 2.
Figure 3C:
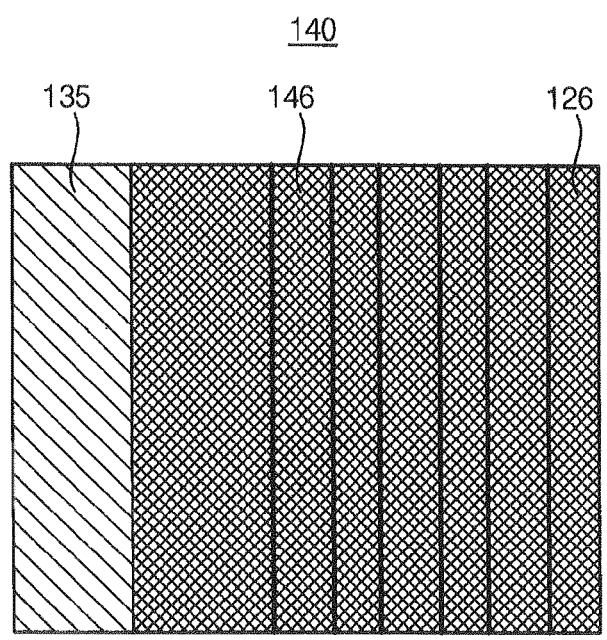
FIG. 3C is a plane view illustrating still another example of forming the contact region of the FIG. 2.

FIG. 3A is a plane view illustrating an example of forming the contact region of the FIG. 2, FIG. 3B is a plane view illustrating another example of forming the contact region of the FIG. 2, and FIG. 3C is a plane view illustrating still another example of forming the contact region of the FIG. 2. Specifically, FIGS. 3A through 3C illustrate examples of the contact region 140 having an uneven pattern when viewed on a plane.

In reference to FIG. 3A, the contact region 140 may have the uneven pattern. The uneven pattern may have at least one concave portion 142 formed in the circular shape. The uneven pattern may be formed by etching the insulation layer 118 in the contact region 140. The power supply line 130 and the light emitting structure 120 may be electrically coupled by laminating the third electrode 135 that is coupled to the power supply line 130 and the second electrode 126 of the light emitting structure 120 on the insulation layer 118 along the uneven pattern in the contact region 140. The third electrode 135 may be disposed under the second electrode 126. The contact region 140 may be formed by arranging the concave portions 142 that are circular shapes in a lattice shape when viewed on a plane.

In reference to FIG. 3B, the contact region 140 may have the uneven pattern. The uneven pattern may have at least one concave portion 142 formed in the diamond-like shape. The uneven pattern may be formed by etching the insulation layer 118 in the contact region 140. The power supply line 130 and the light emitting structure 120 may be electrically coupled by laminating the third electrode 135 that is coupled to the power supply line 130 and the second electrode 126 of the light emitting structure 120 on the insulation layer 118 along the uneven pattern in the contact region 140. The third electrode 135 may be disposed under the second electrode 126. The contact region 140 may be formed by arranging the concave portions 142 that are diamond-like shapes in the lattice shape when viewed on a plane.

In reference to FIG. 3C, the contact region 140 may have the uneven pattern. The uneven pattern may have at least one concave portion 142 formed in the rectangular shape. The uneven pattern may be formed by etching the insulation layer 118 in the contact region 140. The power supply line 130 and the light emitting structure 120 may be electrically coupled by laminating the third electrode 135 that is coupled to the power supply line 130 and the second electrode 126 of the light emitting structure 120 on the insulation layer 118 along the uneven pattern in the contact region 140. The third electrode 135 may be disposed under the second electrode 126. The contact region 140 may be formed by spacing the concave portions 142 that are rectangular shapes by predetermined distance each other when viewed on a plane.

As describe above, the third electrode 135 and the second electrode 126 may have the uneven pattern in the contact region 140. Thus, the contact area of the third electrode 135 and the second electrode 126 may be increased in the contact region 140. The power supply voltage may be stably provided to the light emitting structure 120 from the power supply line 130 by increasing the contact area of the third electrode 135 and the second electrode 126. The uneven pattern may have various shape, not limited to FIGS. 3A through 3C. Although the third electrode 135 and the second electrode 126 are depicted in FIGS. 3A through 3C, the insulation layer 118 may be disposed under the third electrode 135.

Figure 4:
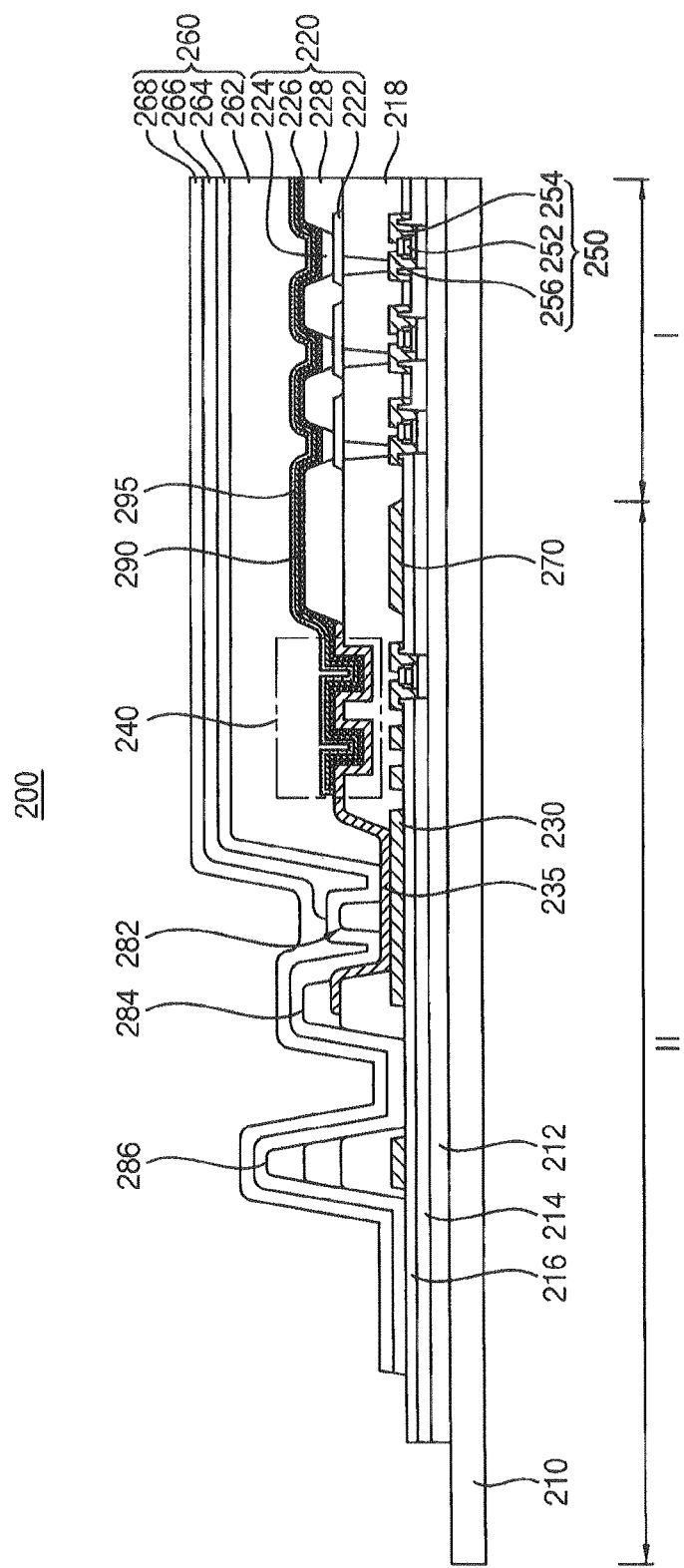
FIG. 4 is a cross-sectional view illustrating an OLED device according to example embodiments.
Figure 5:
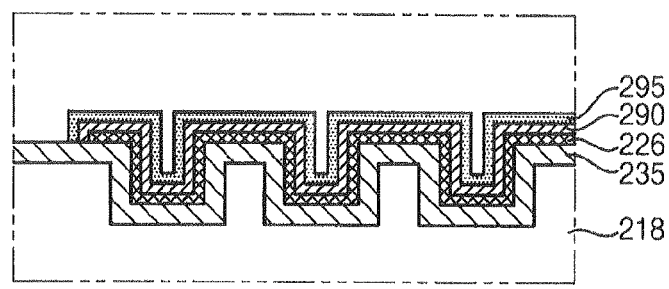
FIG. 5 is a cross-sectional view illustrating a contact region that is included in the OLED device of FIG. 4.

FIG. 4 is a cross-sectional view illustrating an OLED device according to example embodiments and the FIG. 5 is a cross-sectional view illustrating a contact region that is included in the OLED device of FIG. 4. The OLED device 400 illustrated in FIG. 4 may be the same as or similar to the OLED device 100 described in FIG. 1 except that a light efficiency improvement layer 290 and/or a protective layer 295 are/is additionally formed on the second electrode 226. Thus, duplicated description will not be repeated.

The light efficiency improvement layer 290 may be formed on a second electrode 226. The light efficiency improvement layer 290 may extend to a contact region 240 having an uneven pattern. The light efficiency improvement layer 290 may allow light generated from a light emitting structure 220 to be efficiently emitted to outside. In some example embodiments, the light efficiency improvement layer 290 may generate optical constructive interference that acts on the light generated from the light emitting structure 220. The light efficiency of respective colors may be maximized by forming a different thickness of the light efficiency improvement layer 290 according to a wavelength of the light generated from the light emitting structures 220. The light efficiency improvement layer 290 may include at least one organic material or inorganic material among $SiO_2$, $SiN_x$, $ZnO_2$, $TiO_2$, $ZrO_2$, ITO, IZO, Alq3, CuPc, CBP, a-NPB, and $ZiO_2$. In other example embodiments, the light efficiency improvement layer 290 may generate plasmon resonance that acts on the light generated from the light emitting structures 220. For example, the light efficiency improvement layer 290 may include nanoparticles.

The protective layer 295 may be formed on the second electrode 226. The protective layer 295 may extend to the contact region 240 in which the uneven pattern 252 is formed. The protective layer 295 may prevent the light emitting structures 220 from heat and/or plasma that are/is generated by chemical vapor deposition (CVD) process and/or sputtering process for forming the encapsulation member 280. The protective layer 295 may be formed of an epoxy-based sealant. For example, the epoxy-based sealant may be formed of at least one selected from bisphenol type epoxy resin, epoxidized butadiene resin, fluorine type epoxy resin, novolac type epoxy resin, etc.

In reference to FIG. 5, the contact region 240 may be formed by sequentially laminating the third electrode 235 that is coupled to the power supply line 230, the second electrode 226 of the light emitting structure 220, the light efficiency improvement layer 290, and the protective layer 295 on the insulation layer 218 having uneven pattern. The third electrode 235, the second electrode 226, the light efficiency improvement layer 290, and the protective layer 295 may be formed along the uneven pattern that is formed on the insulation layer 218. The protective layer 295 may be formed to encapsulate an end of the second electrode 226 to prevent the light emitting structures 220 from being damaged during a forming process of the encapsulation member 260. The light efficiency improvement layer 290 and the protective layer 295 may be selectively formed on the second electrode 226. In some example embodiments, the light efficiency improvement layer 290 may be formed on the second electrode 226. In other example embodiments, the protective layer 295 may be formed on the second electrode 226. In other example embodiments, the light efficiency improvement layer 290 and the protective layer 295 may be formed on the second electrode 226.

As described above, the OLED device 200 may include the light efficiency improvement layer 290 and the protective layer 295 on the second electrode 226. In the contact region 240, the third electrode 235 that is coupled to the power supply line 230 and the second electrode 226 of the light emitting structure 220 may be sequentially laminated on the uneven pattern of the insulation layer 218. The contact area of the third electrode 235 and the second electrode 226 may be increased because the third electrode 235 and the second electrode 226 are formed along the uneven pattern of the insulation layer 218. Although the area of the peripheral region II is decreased for a slim display device, the contact area of the third electrode 235 and the second electrode 226 may be increased by having the uneven pattern. Thus, the contact resistance may be decreased and the power supply voltage may be stably provided to the light emitting structure 220. Additionally, the light efficiency improvement layer 290 and the protective layer 295 may be selectively formed on the second electrode 226. The light efficiency improvement layer 290 may increase the light efficiency of the light emitting structure 220. The protective layer 295 may prevent the light emitting structure 220 from heat and/or plasma that are/is generated during the forming process of the encapsulation member 260.

Figure 6A:
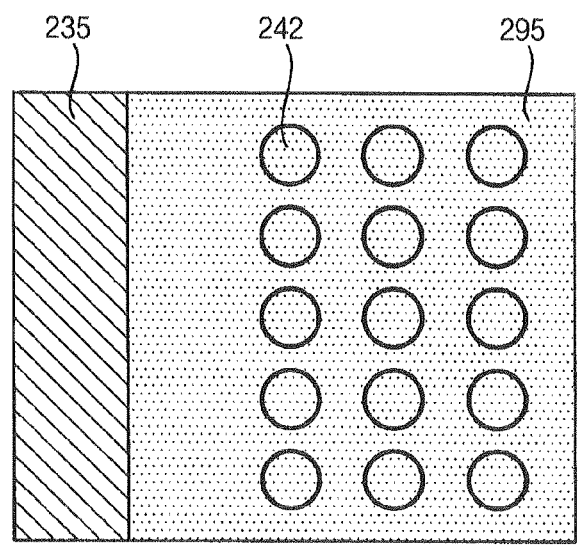
FIG. 6A is a plane view illustrating an example of forming the contact region of the FIG. 4.
Figure 6B:
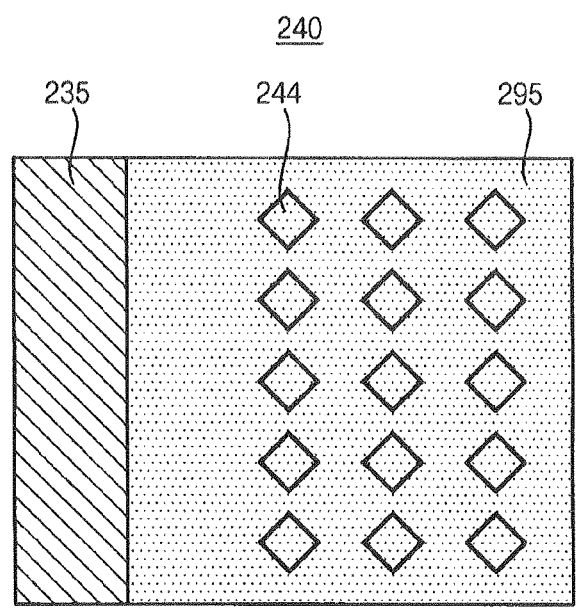
FIG. 6B is a plane view illustrating another example of forming the contact region of the FIG. 4.
Figure 6C:
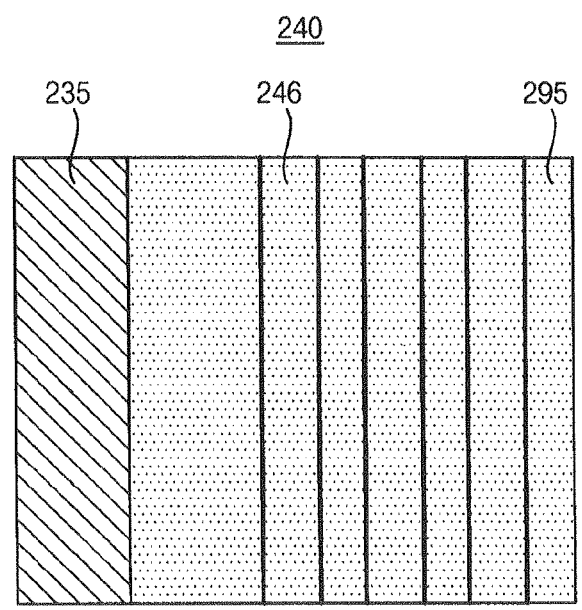
FIG. 6C is a plane view illustrating still another example of forming the contact region of the FIG. 4.

FIG. 6A is a plane view illustrating an example of forming the contact region of the FIG. 4, FIG. 6B is a plane view illustrating another example of forming the contact region of the FIG. 4, and FIG. 6C is a plane view illustrating still another example of forming the contact region of the FIG. 4. Specifically, FIGS. 6A through 6C illustrate examples of the contact region 240 having an uneven pattern when viewed on a plane.

In reference to FIG. 6A, the contact region 240 may have the uneven pattern. The uneven pattern may have at least one concave portion 242 formed in the circular shape. The uneven pattern may be formed by etching the insulation layer 218 in the contact region 240. The power supply line 230 and the light emitting structure 220 may be electrically coupled by laminating the third electrode 235 that is coupled to the power supply line 230 and the second electrode 226 of the light emitting structured 220 on the insulation layer 218 along the uneven pattern in the contact region 240. The third electrode 235 may be disposed under the second electrode 226. In some example embodiments, the light efficiency improvement layer 290 that improves the light efficiency of the light emitting structure 220 may be formed on the second electrode 226. The light efficiency improvement layer 290 may be formed on the second electrode 226 along the uneven pattern in the contact region 240. In other example embodiments, the protective layer 295 that prevents the light emitting structure 220 from being damaged during a forming process of the encapsulation member 260 may be formed on the second electrode 226. The protective layer 295 may be formed on the second electrode 226 along uneven pattern in the contact region 240. The contact region 240 may be formed by arranging the concave portions 242 that are circular shapes in a lattice shape when viewed on a plane.

In reference to FIG. 6B, the contact region 240 may have the uneven pattern. The uneven pattern may have at least one concave portion 242 formed in the diamond-like shape. The uneven pattern may be formed by etching the insulation layer 218 in the contact region 240. The power supply line 230 and the light emitting structure 220 may be electrically coupled by laminating the third electrode 235 that is coupled to the power supply line 230 and the second electrode 226 of the light emitting structure 220 on the insulation layer 218 along the uneven pattern in the contact region 240. The third electrode 235 may be disposed under the second electrode 226. In some example embodiments, the light efficiency improvement layer 290 that improves the light efficiency of the light emitting structure 220 may be formed on the second electrode 226. The light efficiency improvement layer 290 may be formed on the second electrode 226 along the uneven pattern in the contact region 240. In other example embodiments, the protective layer 295 that prevents the light emitting structure 220 from being damaged during the forming process of the encapsulation member 260 may be formed on the second electrode 226. The protective layer 295 may be formed on the second electrode 226 along the uneven pattern in the contact region 240. The contact region 240 may be formed by arranging the concave portions 242 that are diamond-like shapes in a lattice shape when viewed on a plane.

In reference to FIG. 6C, the contact region 240 may have the uneven pattern. The uneven pattern may have at least one concave portion 242 formed in the rectangular shape. The uneven pattern may be formed by etching the insulation layer 218 in the contact region 240. The power supply line 230 and the light emitting structure 220 may be electrically coupled by laminating the third electrode 235 that is coupled to the power supply line 230 and the second electrode 226 of the light emitting structure 220 on the insulation layer 218 along the uneven pattern in the contact region 240. The third electrode 235 may be disposed under the second electrode 226. In some example embodiments, the light efficiency improvement layer 290 that improves the light efficiency of the light emitting structure 220 may be formed on the second electrode 226. The light efficiency improvement layer 290 may be formed on the second electrode 218 along the uneven pattern in the contact region 240. In other example embodiments, the protective layer 295 that prevents the light emitting structure 220 from being damaged during the forming process of the encapsulation member 260 may be formed on the second electrode 226. The protective layer 295 may be formed on the second electrode 226 along the uneven pattern in the contact region 240. The contact region 240 may be formed by spacing the concave portions 242 that are rectangular shapes by predetermined distance each other when viewed on a plane.

As described above, the third electrode 235 and the second electrode 226 may have the uneven pattern in the contact region 240. Thus, the contact area of the third electrode 235 and the second electrode 226 may be increased in the contact region 240. The power supply voltage may be stably provided to the light emitting structure 220 from the power supply line 230 by increasing the contact area of the third electrode 135 and the second electrode 226. The uneven pattern may have various shape, not limited to FIGS. 6A through 6C. Additionally, the light efficiency improvement layer 290 and the protective layer 295 may be selectively formed on the second electrode 226. The light efficiency improvement layer 290 may increase the light efficiency of the light emitting structure 220. The protective layer 295 may prevent the light emitting structure 220 from heat and/or plasma that are/is generated during the forming process of the encapsulation member 260. Although the third electrode 235 and the protective layer 295 are depicted in FIGS. 6A through 6C, the insulation layer 218 may be disposed under the third electrode 235. Further, the second electrode 226 and the light efficiency improvement layer 290 may be interposed between the third electrode 235 and the protective layer 295.

Figure 7:
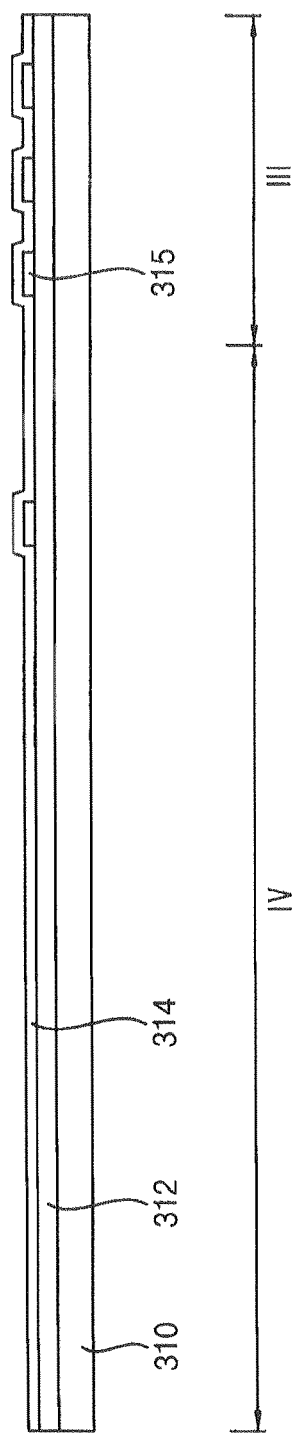
FIGS. 7 through 9 are cross-sectional views illustrating a method of manufacturing the OLED device according to example embodiments.
Figure 8:
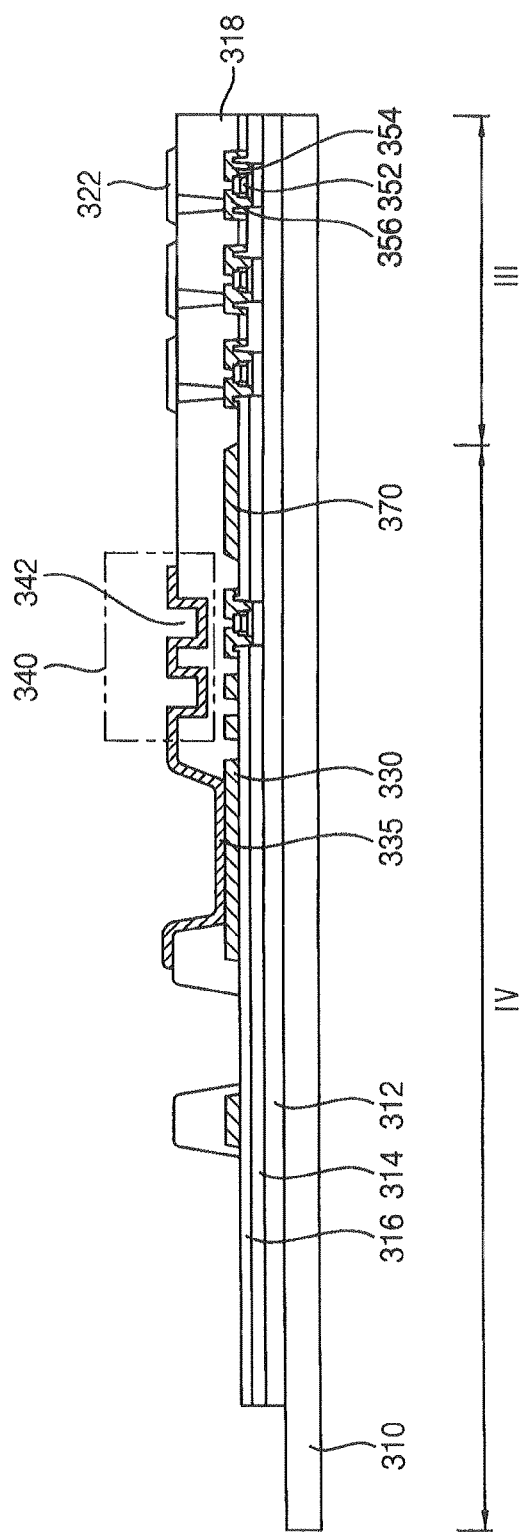
Figure 9:
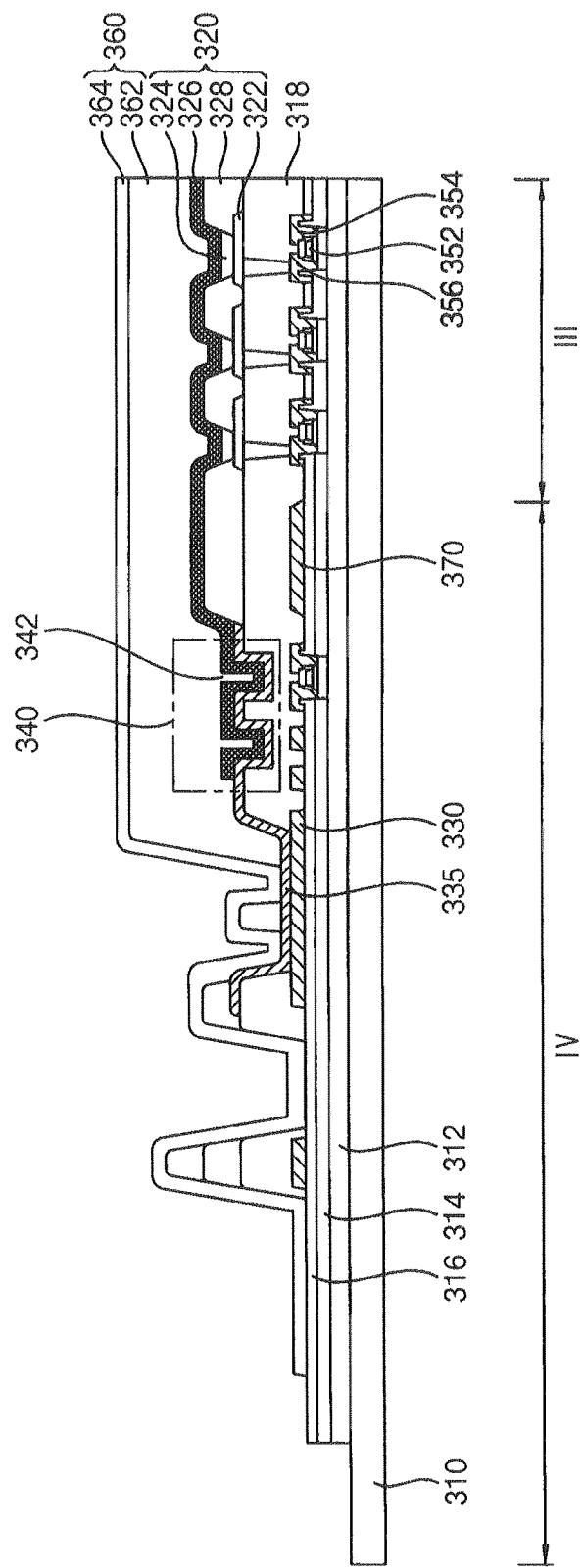

FIGS. 7 through 9 are cross-sectional views illustrating a method of manufacturing the OLED device according to example embodiments. In FIGS. 7 through 9, the method may provide a OLED device having a configuration substantially the same as or substantially similar to that of the OLED device described with reference to FIG. 1, however, those skilled in the art could understand that any one of the OLED device illustrated in FIGS. 7 through 9 may be obtained by obvious modifications or changes of the processes such as patterning or etching processes.

In reference to FIGS. 7 through 9, the method of manufacturing the OLED device may dispose a plurality of first electrodes 322 in a display region III of a substrate 310 that includes the display region III and a peripheral region IV, may form a plurality of light emitting layers 324 on the first electrode 322, and may form a second electrode 326 that extends to a contact region 340 and has an uneven pattern in the contact region 340 on the light emitting layers 324. The method of manufacturing the OLED device may form a power supply line 330 in the peripheral region IV, may form a third electrode 335 that extends to the contact region 340 and have the uneven pattern in the contact region 340 to contact with the second electrode 326, and may form an encapsulation member 360 that encapsulates the display region III and the peripheral region IV.

Specifically, in reference to FIG. 7, there is provided the substrate 310 having the display region III and a peripheral region IV. Light emitting structures may be formed in the display region III of the substrate 310, the contact region and the power supply line may be formed in the peripheral region IV of the substrate 310. In some example embodiments, the substrate 310 may include a flexible transparent resin. For example, the substrate 310 may include polymethylmethacrylate-based resin, polyimide-based resin, acryl-based resin, polyacrylate-based resin, polycarbonate-based resin, polyether-based resin, sulfonic acid-based resin, polyethylene terephthalate-based resin, etc. In other example embodiments, the substrate 310 may include a transparent ceramic substrate such as a glass substrate, a quartz substrate, a transparent alumina substrate, etc.

A buffer layer 312 may be disposed on the substrate 310. The buffer layer 312 may extend from the display region III into the peripheral region IV. The buffer layer 312 may be formed using silicon compound, transparent resin, etc. For example, the buffer layer 312 may be formed using silicon oxide, silicon nitride, silicon oxynitride, silicon oxycarbide, polyacrylate-based rein, polymethacrylate-based resin, olefin-based resin and/or polyvinyl-based resin. Further, the buffer layer 312 may be obtained by a spin coating process, a printing process, a thermal treatment process, a chemical vapor deposition process, etc.

Active patterns 315 may be formed on the buffer layer 312. The active patterns 315 may be formed in the display region III and the peripheral region IV. Each of the active patterns 315 may include polysilicon, polysilicon containing impurities, partially crystallized silicon, silicon containing micro crystals, semiconductor oxide, etc.

A gate insulation layer 314 may be formed on the buffer layer 312 to cover the active patterns 315. The gate insulation layer 314 may be uniformly formed on the buffer layer 312. In some example embodiments, the gate insulation layer 314 may be formed using silicon compound such as silicon oxide, silicon oxycarbide, silicon oxynitride, etc. In other example embodiments, the gate insulation layer 314 may be formed using metal oxide such as hafnium oxide, aluminum oxide, zirconium oxide, titanium oxide, tantalum oxide, etc. Further, the gate insulation layer 314 may be formed by a chemical vapor deposition process, a spin coating process, a plasma enhanced chemical vapor deposition process, a sputtering process, a vacuum evaporation process, a high density plasma-chemical vapor deposition process, a printing process, etc.

In reference to FIG. 8, gate electrodes 352 may be formed on the gate insulation layer 314. The gate electrodes 352 may be formed using metal, alloy, conductive metal oxide, transparent conductive material, etc. Further, the gate electrodes 352 may be formed by the sputtering process, the chemical vapor deposition process, the pulsed laser deposition process, the vacuum evaporation process, the atomic layer deposition process, etc. The gate electrodes 352 may be disposed on portions of the gate insulation layer 314 under which the active patterns 315 are positioned in the display region III and the peripheral region IV. Although it is not illustrated in FIG. 8, lines such as gate line that are electrically coupled to the gate electrodes 352 may be disposed on the gate insulation layer 314 in the display region III and the peripheral region IV. An insulating interlayer 316 may be formed on the gate insulation layer 314 to cover the gate electrodes 352. The insulating interlayer 316 may be formed using silicon compound, transparent resin, etc. Additionally, the insulating interlayer 316 may be formed by a printing process, a spin coating process, a chemical vapor deposition process, etc. Source regions and drain regions may be formed in the active patterns 315 by implantation of impurities using the gate electrodes 352 as masks.

The insulating interlayer 316 may be partially etched to form contact holes that expose the source and the drain regions of the active patterns 315. Drain electrodes 356 and the source electrodes 354 may be formed on the insulating interlayer 316 to fill the contact holes. At the same time, data lines 370 and the power supply line 330 may be formed on the insulating interlayer 316 in the display region III and the peripheral region IV. The drain electrodes 356 may be coupled to the drain regions of the active patterns 315, and the source electrodes 354 may be coupled to the source regions of the active patterns 315. As formations of the drain electrodes 356 and the source electrodes 354, transistors may be provided over the substrate 310. The drain electrodes 356 and the source electrodes 354 may include metal, alloy, metal nitride, conductive metal oxide, transparent conductive material, etc.

An insulation layer 318 may be formed on the insulating interlayer 316 to cover the transistors in the display region III and to cover portions of the power supply line 330 in the peripheral region IV. The insulation layer 318 may extend to cover outermost power supply line 330. The insulation layer 318 may be formed using organic material such as polyimide-based resin, photoresist, acryl-based resin, polyamide-based resin, siloxane-based resin, etc. Further, the insulation layer 318 may be formed by a printing process, an ink jet process, a spin coating process, etc. Alternatively, the insulation layer 318 may be formed using inorganic material such as silicon compound, metal oxide, etc.

The insulation layer 318 in the display region III may be partially etched to form contact holes that expose the drain electrodes 356 of transistors. First electrodes 322 may be formed on the insulation layer 318 in the display region III to fill the contact holes. The first electrodes 322 may be electrically coupled to the drain electrodes 356 passing through the contact holes formed on the insulation layer 318.

The insulation layer 318 in the peripheral region IV may be partially etched to form the uneven pattern. The third electrode 335 that is coupled to the power supply line 330 may be formed. The third electrode 335 may extent to the contact region 340. The third electrode 335 may be formed along the uneven pattern of the insulation layer 318 in the contact region 340. The third electrode 335 may be simultaneously formed with the first electrodes 322. The first electrodes 322 and the third electrode 335 may be formed using metal, alloy, metal nitride, conductive metal oxide, transparent conductive material, etc. For example, the first electrodes 322 and the third electrode 335 include aluminum, alloy containing aluminum, aluminum nitride, silver, alloy containing silver, tungsten, tungsten nitride, copper, alloy containing copper, nickel, chrome, chrome nitride, molybdenum, alloy containing molybdenum, titanium, titanium nitride, platinum, tantalum, tantalum nitride, neodymium, scandium, strontium ruthenium oxide, indium tin oxide, indium zinc oxide, zinc tin oxide, zinc oxide, tin oxide, indium oxide, gallium oxide, etc. These may be used alone or in a combination thereof. Further, the first electrodes 322 and the third electrode 335 may be formed by the sputtering process, the printing process, the chemical vapor deposition process, the vacuum deposition process, etc.

In reference to FIG. 9, a pixel defining layer 328 may be formed on the first electrodes 322 and the insulation layer 318 in the display region III. The pixel defining layer 328 may have openings that partially expose the first electrodes 322. The pixel defining layer 328 may be formed using a halftone mask, a halftone slit mask, etc. For example, the pixel defining layer 328 may be formed using polyimide-based rein, photoresist, polyacryl-based resin, polyamide-based resin, siloxane-based resin, etc. Further, the pixel defining layer 328 may be formed by the printing process, the ink jet process, the spin coating process, etc.

Light emitting layers 324 may be respectively disposed on the first electrode 322 exposed by the openings of the pixel defining layer 328. In forming of the light emitting layers 324, an organic light emitting layer (EL), a hole injection layer (HIL), a hole transfer layer (HTL), an electron transfer layer (ETL), and a electron injection layer (EIL) may be successively formed on each first electrode 322. Here, the organic light emitting layers may be formed using light emitting materials for generating a red color of light, a green color of light and a blue color of light according to the types of pixels in the OLED device. Alternatively, each organic light emitting layer may be obtained by stacking a plurality of light emitting materials for generating a red color of light, a green color of light, and a blue color of light on each first electrode 332 to thereby emit a white color of light.

The second electrode 326 may be formed on the light emitting layers 324 and the pixel defining layer 328. The second electrode 326 may extend to the contact region 340 in the peripheral region IV. The second electrode 326 may contact with the third electrode 335 in the contact region 340. Here, the second electrode 326 may be formed along the uneven pattern in the contact region 340 because the second electrode 326 is formed on the third electrode 335 that is formed along the uneven pattern in the contact region 340. The second electrode 326 may be formed using metal, alloy, metal nitride, conductive metal oxide, transparent conductive material, etc. In some example embodiments, the uneven pattern may have at least one concave portion 342 formed in a circular shape. In other example embodiments, the uneven pattern may have at least one concave portion 342 formed in a diamond-like shape. In other example embodiments, the uneven pattern may have at least one concave portion 342 formed in a rectangular shape.

A first organic layer 362 may be formed to cover the light emitting structures 320 in the display region III and a portion of the power supply ling 330 in the peripheral region IV. The first organic layer 362 may be formed using polyimide-based resin, polyacryle-based resin, polyamide-based resin, etc. Further, the first organic layer 362 may be formed by the printing process, the inkjet process, the spin coating process, the vacuum evaporation process, etc.

A first inorganic layer 364 may be formed on the first organic layer 362. The first inorganic layer 364 may be formed using metal compound by the vacuum evaporation process, the sputtering process, the chemical vapor deposition process, etc.

Although it is not illustrated in FIG. 9, an additional organic layer and an additional inorganic layer may be alternately formed on the first inorganic layer 364, so that the OLED device may have a configuration substantially the same as or substantially similar to that of the OLED device 100 described with reference to FIG. 1. More than two additional organic layers and more than two additional inorganic layers may be alternately formed on the first inorganic layer 364.

As described above, the contact region 340 having the uneven pattern may be formed in the peripheral region IV of the OLED device. The third electrode 335 that is coupled to the power supply line 330 and the second electrode of the light emitting structures may have the uneven pattern in the contact region 340. Thus, a contact area of the third electrode 335 and the second electrode 326 may be increased in the contact region 340. Although the area of the peripheral region IV is decreased for a slim display device, the contact area of the third electrode 335 and the second electrode 326 may be increased by having the uneven pattern. Thus, the contact resistance may be decreased and the power supply voltage may be stably provided to the light emitting structure 320.

The present inventive concept may be applied to an electronic device having an organic light emitting display device. For example, the present inventive concept may be applied to a computer monitor, a laptop, a digital camera, a cellular phone, a smart phone, a smart pad, a television, a personal digital assistant (PDA), a portable multimedia player (PMP), a MP3 player, a navigation system, a game console, a video phone, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. An organic light emitting display (OLED) device, comprising:
    a substrate having a display region and a peripheral region;
    a plurality of first electrodes disposed in the display region;
    a plurality of light emitting layers formed on the first electrodes;
    a second electrode formed on the light emitting layers, the second electrode extending to a contact region and having an uneven pattern in the contact region;
    a power supply line disposed in the peripheral region;
    a third electrode formed on the power supply line, the third electrode extending to the contact region and having the uneven pattern in the contact region to contact with the second electrode having the uneven pattern; and
    an encapsulation member encapsulating the display region and the peripheral region,
    wherein said uneven pattern of both the second and third electrodes have at least two concave portions each having a U shape that includes a recess at a first surface and a protrusion geometrically corresponding to the recess at a second surface that is opposite to the first surface, and
    wherein the protrusions of the second electrode occupy the recesses of the third electrode.

2. The OLED device, of claim 1, wherein the concave portions each have a circular shape.

3. The OLED device of claim 1, wherein the concave portions each have a diamond-like shape.

4. The OLED device of claim 1, wherein the concave portions each have a rectangular shape.

5. The OLED device of claim 1, wherein the third electrode is disposed under the second electrode in the contact region.

6. The OLED device of claim 1, wherein the third electrode and the first electrode are simultaneously formed.

7. The OLED device of claim 1, further comprising:
    a plurality of switching structures formed on the substrate.

8. The OLED device of claim 1, further comprising:
    a light efficiency improvement layer interposed between the second electrode and the encapsulation member, the light efficiency improvement layer configured to increase a light emission efficiency.

9. The OLED device of claim 1, further comprising:
    a protective layer interposed between the second electrode and the encapsulation member, the protective layer configured to protect the first electrodes, the light emitting layers, and the second electrode during, a forming process of the encapsulation member.

10. The OLED device of claim 1, wherein the encapsulation member is formed by alternately laminating organic layers and inorganic layers.

* * * * *